United States Patent [19]

Lindmayer

[11] 4,058,418
[45] Nov. 15, 1977

[54] FABRICATION OF THIN FILM SOLAR CELLS UTILIZING EPITAXIAL DEPOSITION ONTO A LIQUID SURFACE TO OBTAIN LATERAL GROWTH

[75] Inventor: Joseph Lindmayer, Bethesda, Md.

[73] Assignee: Solarex Corporation, Rockville, Md.

[21] Appl. No.: 595,418

[22] Filed: July 14, 1975

Related U.S. Application Data

[63] Continuation of Ser. No. 456,727, April 1, 1974, abandoned.

[51] Int. Cl.² .................... H01L 27/14; H01L 29/04; H01L 31/04
[52] U.S. Cl. .................................. 148/175; 29/572; 136/89 TF; 148/1.5; 148/171; 156/607; 156/609; 156/611; 156/612; 357/4; 357/30
[58] Field of Search ................... 148/1.5, 171–173, 148/174, 175; 29/572; 136/89; 156/604, 607, 609–612, DIG. 88

[56] References Cited

U.S. PATENT DOCUMENTS

| | | | |
|---|---|---|---|
| 2,992,903 | 7/1961 | Imber | 156/609 X |
| 3,031,275 | 4/1962 | Shockley | 156/604 |
| 3,139,361 | 6/1964 | Rasmanis | 148/175 |
| 3,160,522 | 12/1964 | Heywang et al. | 148/174 X |
| 3,346,414 | 10/1967 | Ellis et al. | 148/175 |
| 3,348,962 | 10/1967 | Grossman et al. | 156/611 |
| 3,484,302 | 12/1969 | Maeda et al. | 148/171 X |
| 3,533,850 | 10/1970 | Tarneja et al. | 136/89 |
| 3,596,151 | 7/1971 | Eldridge et al. | 136/89 X |
| 3,914,856 | 10/1975 | Fang | 29/572 |

OTHER PUBLICATIONS

Rasmanis, E., "Silicon Thin-Film Diodes and Transistors" Nerem Record, Nov. 7, 1962, pp. 160–161.

Primary Examiner—L. Dewayne Rutledge
Assistant Examiner—W. G. Saba
Attorney, Agent, or Firm—Walter D. Ames

[57] ABSTRACT

A method to manufacture thin film solar cell in which a solar cell to convert directly light to electricity is formed by depositing silicon material on a carrier substrate having a coating which is liquid on the deposition temperature. An article manufactured according to this method. A machine for the manufacture of thin film solar cells.

12 Claims, 11 Drawing Figures

FABRICATION OF THIN FILM SOLAR CELLS UTILIZING EPITAXIAL DEPOSITION ONTO A LIQUID SURFACE TO OBTAIN LATERAL GROWTH

This application is a continuation of my application Ser. No. 456,727, filed Apr. 1, 1974, and now abandoned.

BACKGROUND OF THE INVENTION

Solar cells are being utilized to convert light into electricity in which photons going through a semiconductor, release electrons and holes which are then separated by means of an electric field in the semiconductor material. Such solar cells have been known for a long time and are usually made of silicon single crystal wafers. The silicon single crystal wafers are fabricated from silicon single crystal ingots which are pulled by one of the known techniques; subsequently these ingots are sliced into thin slices in the range of several thousandths of an inch up to about .025 inch. These silicon single crystal wafers are then processed which processing is well known from the art. The problem with this approach is that the silicon single crystal material is very expensive. In order to produce inexpensive solar cells one has to use less and less amount of silicon single crystal material. This is, however, limited by the slicing techniques and the general brittleness of the silicon material as it gets thinner. The actual limit today is approximately 0.003 to 0.006 inch thickness, but with the waste caused by the slicing and polishing the minimum amount of silicon utilized to produce one wafer is about 0.006 to 0.020 inch. The major cost in solar cells when the fabrication technology is improved is the price of the silicon single crystal material.

A possibility to reduce the cost of solar cells would be to use inexpensive polycrystalline silicon material instead of single crystal silicon material. Experimental solar cells made of polycrystalline material give very low efficiency. While the terrestrial efficiency of solar cells made of single crystal material is typically on the order of 8 through 18 percent, polycrystalline materials efficiency is on the order of 1%. A relation exists between the crystallinity and the efficiency. It was found that for example, a 5% terrestrial efficiency would require a defect state density of less than $10^{18}$ cm$^{-3}$. This means that a silicon material with reasonably good order and with relatively few grain boundaries is needed to obtain useful efficiency. While the utilization of polycrystalline silicon would reduce the cost of the silicon material as it costs a fraction of the single crystal material, the efficiency of these devices because of their polycrystalline nature is low and therefore the practicality of this approach is not economically attractive.

The above means that inexpensive silicon cells will require that single or large crystal silicon must be utilized in the solar cells. A way to reduce the amount of silicon to be utilized is to make solar cells of an extremely thin silicon film in the order of 0.1 – 100 micronmeter. This approach was tried many times in which a thin silicon film was deposited on a substrate, but as of now no successful method has been developed which would produce efficient solar cells this way. While thin films of silicon are usually characterized as polycrystalline, this description covers almost everything between the single crystal and the amorphous state. One of the problems was that deposited silicon material either conforms to the crystal structure of the underlying substrate material or the material deposits in an amorphous state without any crystal structure. The problems originate from the fact that the deposited silicon material grows rather perpendicular to the surface taking up the underlying crystal structure and forms an epitaxial growth. This type of method is utilized many times in semiconductor device manufacturing, but it is detrimental to the solar cell fabrication in which a large area of good crystalline structure is needed. The amorphous silicon is useless for solar cell application. While the thin film silicon deposition is well known it is evident that the order required for thin films to make solar cells was not obtained until now, on a noncrystalline substrate.

From the above it is obvious that a new method is required to produce inexpensive thin film solar cells with high efficiency and good yield.

BRIEF SUMMARY OF THE INVENTION

Various silicon thin film deposition techniques are well known today. Some of them utilize evaporated or sputtered silicon material, others utilize vapor deposition techniques in which a gaseous silicon compound is utilized.

The deposition techniques for silicon are well known today from the state of the art. In the particular approach proposed here, thin film of silicon will be deposited on a metallic foil, and any of the known techniques of depositing silicon may be utilized to produce silicon solar cells. This approach pursues a unique and specific direction.

In order to force the deposition into an orderly structure the following general conditions must be met. The carrying substrate should have a melting point above the silicon depositing temperature. The substrate should be coated with a material that is liquid at the deposit temperature. The coating material should be or should contain a desired dopant. For example, for an n-p cell the coating metal should provide a p+ region in the silicon. For a p-n cell the coating material should provide an n+ region in the silicon. The substrate and the depositing silicon material should move in relation to one another. For example, when the deposition beam is stationary the substrate must be moving in the deposition chamber. Silicon may be deposited through a suitable aperture so that the crystallization beings at a seed point, subsequently spreading over the width of the substrate and then continuing to grow laterally over the liquid phase substrate. The above-described conditions will provide for the growth of an ordered silicon film.

When this silicon film is deposited on a solid surface by any known method, it will grow epitaxially, or form a polycrystalline or amorphous layer, neither of which is suitable for the formation of an efficient and inexpensive solar cell. In the technique described here, however, upon entering into the deposition area the coating metal on the substrate will melt and therefore will provide a floating base. This way the silicon arriving through an aperture will deposit on a liquid surface which has no crystalline structure and no orientation. The problem with such material is that when silicon is deposited on this surface it may deposit itself in an amorphous form. It was found, however, that silicon can be deposited on some liquid surface or on surfaces which have no crystalline structure, and it was also found that single crystallization silicon may be deposited by forcing the silicon material deposited from gas, vapor or from evaporation, sputtering or other known techniques into a crystalline structure by starting its crystallization at one point and moving the liquid underneath so that the deposited silicon is gradually building up from the point of crystallization in a lateral direction. As the silicon arrives through an aperture and the base is moving, the newly arriving silicon may find it "convenient" to orient itself laterally to the region already deposited. In this fashion the layer leaving the deposit chamber is likely to be laterally oriented and will be highly ordered. The above-described system will provide the required low defect state density "large crystallites" of $10^{18}$ cm$^{-3}$ or less. If these conditions are met then a thin film silicon solar cell with suitable efficiency can be created.

By governing the speed at which the liquid coated carrier substrate is moving under the silicon vapor, the crystallization and the thickness of the layer can be adjusted. This speed will have an effect on the size of the crystallites on the doping and also on the thickness of the layer. The amount of silicon vapor which means the density of the silicon containing vapor above the carrier as well as the slit size and shape will also have a definite effect on the above. Other effects will come from the carrier metal utilized as well as from the coating material. All of these variables have a very large range whereby setting one parameter the others have to be changed empirically to meet the conditions to obtain the desired large or single crystal thin film silicon material.

Clearly the substrate material must be inexpensive and must be selected to have a higher melting point than the temperature where the deposition takes place. Such material may be selected from a large variety. It may be a tantalum foil, steel, aluminum or even low grade "metallurgical" silicon. There is no other restriction on the material except its melting point. The coating material has to be selected to be liquid at the silicon deposition temperature. It may be aluminum applied to the carrier material by any of the known coating or plating techniques. If the deposition temperature is over 660° C the aluminum layer will melt and form an alloy with the deposited silicon. This system has a eutectic temperature of 577° C. The alloyed region of silicon remains in the liquid phase until it cools below 577° C. Upon recrystallization the bottom part of the film automatically becomes heavily p-type. The importance of such a region should be heavily emphasized. When the silicon is thin, many of the photogenerated carriers will reach the rear surface; the formation of a p+ junction will provide a retarding field which in turn will keep away the carriers from the rear interface. If such a field is not provided, heavy internal recombination will occur, causing a great loss in the photocurrent. If the cell is made with aluminum as the coating metal, the cell must be the n-p type. (For the p-n type cell Sb, Bi or other materials with n-type character must be used.) Many other materials may also be used as coatings — indium, tin, or lead are metals which may be used with dopants of arsenic or boron or a combination of these or alloys. Many of these materials are generally used for semiconductor doping and those materials may also be prepared as a coating on the substrate. While several materials were described, others may be used to substitute them by those who are knowledgeable in the art.

BRIEF DESCRIPTION OF THE DRAWINGS

A better understanding of the invention may be had by the following description taken in conjunction with the accompanying drawings in which.

DETAILED DESCRIPTION

Figure 1:
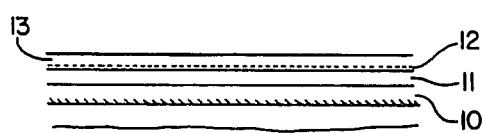
FIG. 1 is a cross-sectional view of a deposited structure.

FIG. 1 shows a carrier film 10 on which a coating material 11 was deposited on which a silicon film 13 was deposited. Region 12 indicates the area where the doping already took place.

Figure 2:
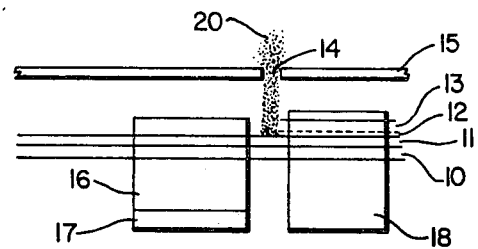
FIG. 2 is the cross section of the schematic of the principle of the deposition.

FIG. 2 represents a cross-sectional view of the schematics of a system when the deposition takes place. The carrier substrate 10 is coated with the coating material 11 onto which the silicon material 13 is deposited from silicon vapor 20 arriving through a slot 14 which slot is a part of a mask 15 refraining the silicon vapor to deposit itself on any other place but on the place underneath the slot. The carrier substrate 10 with its coating 11 undergoes a heating in the area 16 before it arrives under the slot in order to bring the carrier to a temperature where the coating material melts and to a temperature which is suitable for deposition. This will be achieved by a heater 17. After the carrier travels underneath the slot it may be cooled by means of a cooler 18. However, this cooler may not be needed as the apparatus may be designed so that the foil will cool itself by traveling over heat-conducting parts of the machinery.

Figure 3:
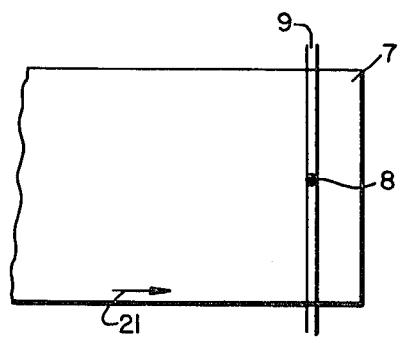
FIG. 3 is a top view of the schematic of the deposition.

FIG. 3 is the top view of the above system in which carrier already coated with the coating 7 has a seed 8 developed at one point and the slot 9 is just above that seed to which the vapor deposition will take place. In this embodiment the carrier will travel in the direction marked by an arrow 21.

Figure 4:
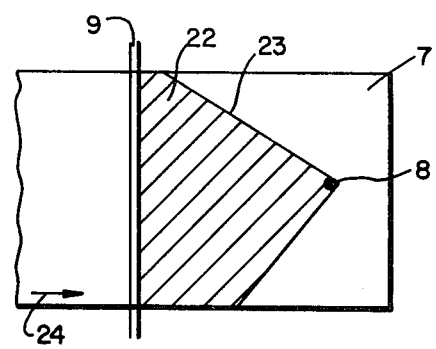
FIG. 4 is a top view of the schematic of the deposition.

FIG. 4 shows another top view of the deposit system. In this one the slot 9 already moved over an area on the carrier where the deposit already took place. In this case the coated carrier had a seed 8 and the deposition of the silicon layer 22 already is in process. The differences between this embodiment and the one described in FIG. 3 is that this carrier at the beginning where the seed was deposited contains two barrier lines 23 which will direct the growth of the seed. In this case the seed is forced to grow into an always widening area. This approach is specifically advisable in the case where the carrier film is wide. The deposited silicon film is then growing from this seed gradually to cover the entire width of the coated carrier 7 surface. The direction of the movement is here indicated by arrow 24. The barrier 23 may be an indifferent material which is not liquid at the deposition temperature. It may be formed from a wire or a strip or even from a protrusion of the original carrier material 7. It is also possible that the carrier material is cut out in such a way to form an angle at the seed point and it is held by a wire only so the edge of the carrier material would serve as a barrier to the growth of the single crystal.

Figure 5:
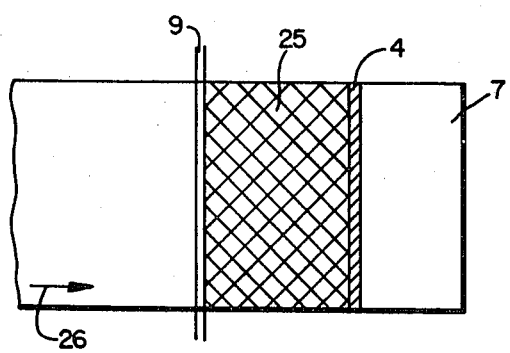
FIG. 5 is another top view of the schematic of the deposition.

FIG. 5 shows another top view of a deposit system in which the slot 9 already moved over an area on the carrier where the deposit already took place. In this case the coated carrier 7 had a seed strip 4 where the seed strip may be a strip of monocrystalline material cut out from an ingot or from a previously coated carrier and deposition took place starting with this seed strip and continuing from there over the area indicated as 25. The movement of the carrier in relation to the slot is indicated by the arrow 26.

Figure 6:
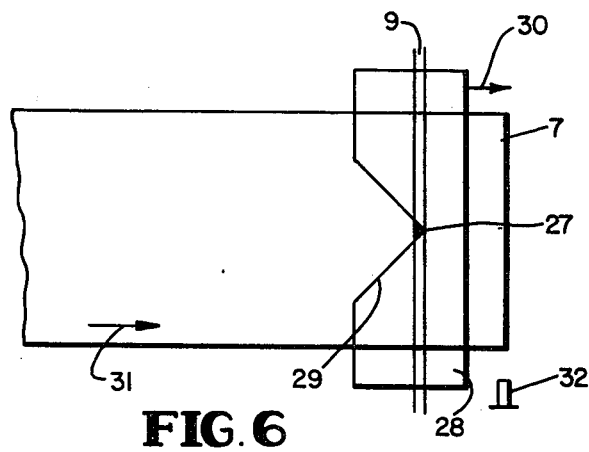
FIG. 6 is another top view of the schematic of the deposition.

FIG. 6 is a top view of a system in which the seed formation and the starting of the silicon film formation is done by mechanical means. In this embodiment the coated carrier film 7 is placed under the slot system composed of a straight slot 9 and the mechanical barrier 28. This mechanical barrier has a cut-out area which will direct the growth of the crystal when the mechanical barrier and the slot are overlaid. Then at one point 27 the seed starts to grow as the vapors going through the slot may arrive on the coated carrier film 7. The coated carrier film 7 and the mechanical barrier 28 will move in the direction of 31 and 30 respectively in relation to the slot 9. As soon as this happens the area of the coated carrier 7 exposed to the silicon vapor will gradually increase all the way up to the edge of the coated carrier. At that point the mechanical barrier 28 will come to a stop by a mechanical means 32 and cease to move. The coated carrier 7 will continue to move in direction 31 in relation to the slot 9.

Figure 7:
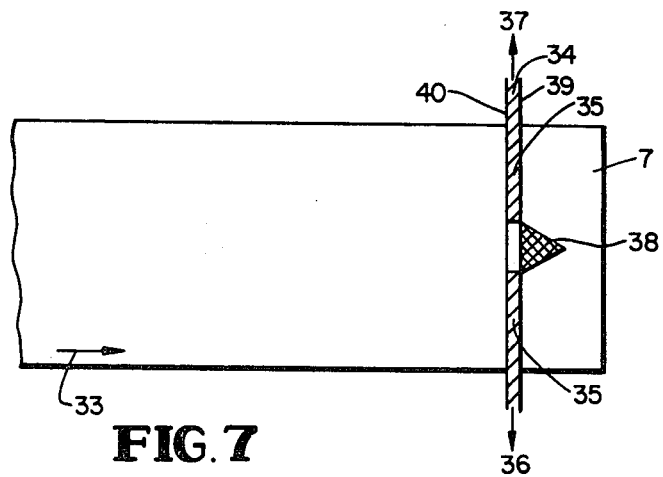
FIG. 7 is a schematic of the deposition system.

Another embodiment of the mechanical seed starting is shown in FIG. 7. In this the coated carrier 7 is moved in the direction of 33 in relation to the slot. The slot 34 has two mechanical moving parts 35, which mechanical moving parts are closed together at the point of origin and they are gradually opened up in the direction of 36 and 37 as far out as the edge of the coated carrier. On FIG. 7 the slot already moved in respect to the carrier and therefore the mechanical slot is already partially open and the silicon formation 38 also already started. As soon as the mechanical moving part 35 opens the slot is defined by its two edges 39 and 40.

Figure 8:
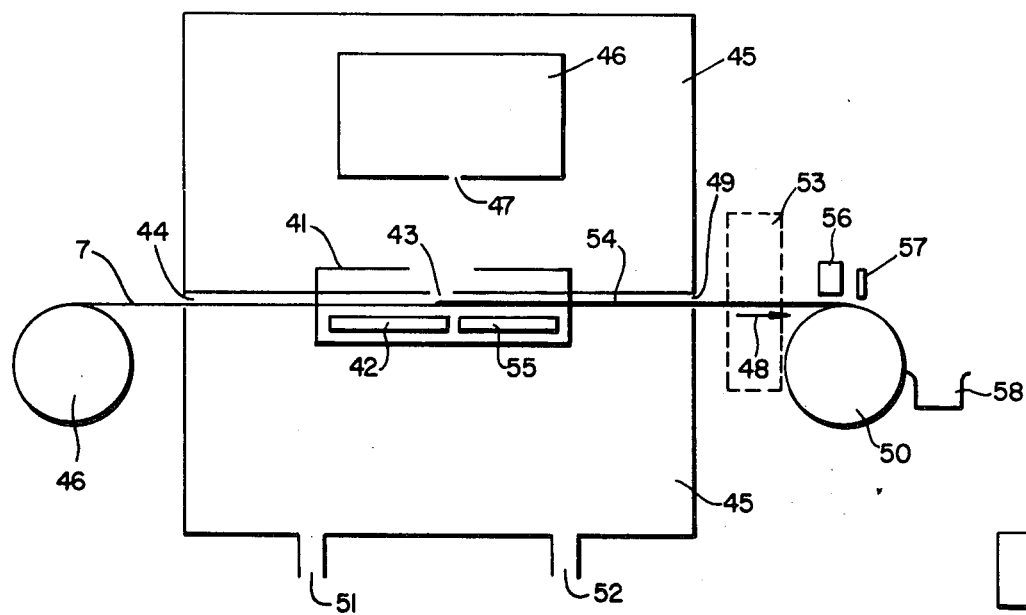
FIG. 8 is a schematic of the deposition system.

FIG. 8 is a schematic of the deposition system. In this embodiment a chamber 45 which has an opening 44 through which the coated carrier film 7 is introduced. The coated carrier film may be stored on a roll 46 but it is also possible that this roll is also stored in a part of the chamber 45. It is also possible that the coated film is introduced not from a roll but from a straight feed system. The coated carrier 7 will then enter in an area 41 in which a heater element 42 brings the temperature of the coated carrier to a point to melt the coating material before it arrived under the slot 43. The silicon vapor generated in area 46 enters chamber 45 through opening 47 and then continues to deposit on the coated carrier 7 entering via slot 43. The starting of the film may be achieved by any of the ways described previously and if a mechanical shutter is used this may be the part of the container 41 or the slot 43. The coated film moving in direction 48 will then carry the formed silicon film 54 which adheres to it and leaves chamber 45 via opening 49 and will be rolled up on roll 50. It may be needed that after the coated carrier with the silicon film 54 leaves the slot area the carrier and its deposit should be cooled. This may be achieved by means 55. It is again emphasized that the roll 50 may be in chamber 45 and it also may be possible not to roll up the film but to obtain it in straight strips and cut them up after it leaves the chamber. The chamber 45 itself may be either kept in vacuum via opening 51 and 52 or gases such as argon, helium, nitrogen or others compatible with the vapor formation may be introduced via opening 51 and exhausted via opening 52. The coated carrier with its deposited silicon film then may enter a diffusion area 53 in which a material such as phosphorous, arsenic or other materials commonly used as such to produce semiconductor devices may be introduced at a predescribed elevated temperature. It is possible that the impurity doping may be achieved by ion implantation or other means used in semiconductor technology. After the coated carrier with its silicon film which is now properly doped with impurities in area 53 leaves the area, it may be submitted to a depositing step in which a conductive material is either evaporated, sprayed or printed on the film in a pattern which would cover not more than 20% of the entire area of the film and providing an ohmic contact to said film. The coated carrier with silicon film and the developed metallic contact pattern will now be rolled up on roll 50 or cut into smaller units by a knife system 57 and collected in a container 58.

Figure 9:
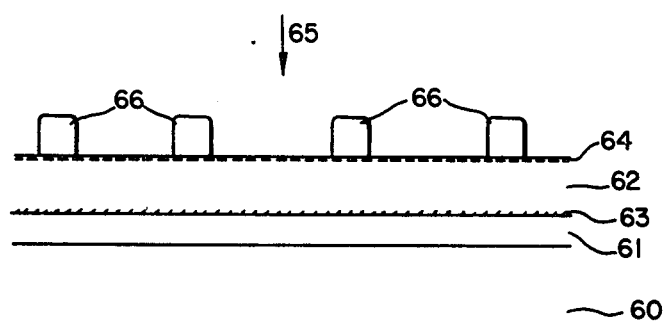
FIG. 9 is a cross-sectional view of an embodiment of the produced solar cell.

FIG. 9 is a cross-sectional view of a solar cell made according to this invention. The carrier film 60 was coated with a layer 61 which was liquid at the silicon deposition temperature. The material contained impurities such as aluminum, indium or arsenic which served as dopant with the deposited silicon. The coating material 61 would not form an alloy with the deposited silicon 62 but the above-mentioned impurities diffuse into the silicon at the deposition temperature and formed a doped layer 63 in an area at the interface. Such an inert material could be, for example, lead. When the silicon material 62 was already deposited, a doping process will take place which develops a doped region 64 in the silicon material. On top of this silicon film a conductive film or pattern 66 was formed by evaporation, plating, screening or printing which is interconnected with each other and which serves to be one of the electrodes to form a circuit. The other electrode is the carrier film 60. When this device is exposed to the light from the direction shown by arrow 65, then a voltage is generated between the contacts 66 and 60 and the cell is able to provide a current into a proper load. In general the dimensions of such a cell are as follows. The carrier film 60 may be in the range of 0.001 to 0.3 inch. The coating 61 may have the dimensions of 0.0001 through 0.025. The deposited silicon film is in the order of 0.0001 to 0.004 inch. The dopant layers 63 and 64 are similar to those which are used customarily in semiconductor devices and in ordinary solar cells. The thickness of the contact pads 66 may vary from 0.001 to 0.1 inch. The linear dimensions of this cell depend on the application. It may be cut into very small units or used in large areas. At any rate the area of the cell utilized will be directly related to the produced current while if interconnected the number of cells interconnected will be directly proportional to the generated voltage.

Figure 10:
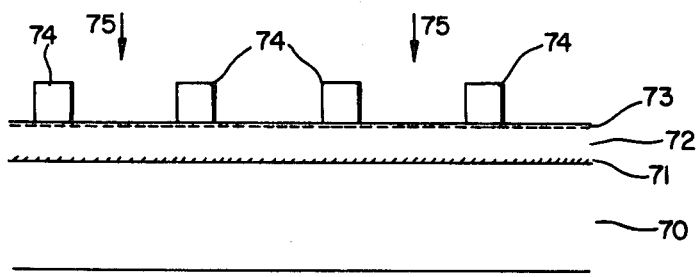
FIG. 10 is another embodiment of the produced solar cell.

FIG. 10 shows a cross-sectional view of another embodiment of a solar cell made according to this invention. The difference between this embodiment and the one shown on FIG. 9 is that the coating material 71 is able to form alloy with the silicon material compared to the coating material 61 on FIG. 9 which is not able to form an alloy. Accordingly the solar cell shown in FIG. 10 has a carrier film 70 the dimensions of which can be similar to those shown on FIG. 9. The coating material 71 in this embodiment is a material which is capable of alloying or diffusing into the silicon material. For this reason this coating material must be thin enough so that on the temperature the deposits took place should not completely short out the entire silicon film. For this purpose the solar cell has to be designed so that the coating material thickness should be less than the silicon material thickness. This means that when the deposition takes place substantially more silicon has to be deposited than that which will be alloyed with the coating material. For this purpose a relatively thin film coating material is preferred in this embodiment. The coating material thickness could be as low as 100 A and certainly lower than that of the silicon films 72 thickness which may vary between 0.0001 to 0.004 inch. An upper limit for the coating material was found to be 1 millimeter. The dopant layer 73 and the conductive pattern 74 are similar to the ones described in connection with FIG. 9. The operation of the cell is again similar to FIG. 9 when the light strikes the cell from the direction 75. Returning again to the role of the coating layer 71, the coating when alloyed or diffused into the silicon film will serve the same purpose as the dopant layer 63 on FIG. 9. The coating layer 71 in this case may be aluminum, indium, gold or other material being liquid at the deposition temperature. The coating may also contain dopants such as arsenic, phosphorous or aluminum.

It has to be mentioned that the description of FIG. 9 and 10 indicates that the solar cell produced utilizing this method may be of an n-p type or also a p-n type by the proper selection of the dopants 64 or 73 respectively and of the coating 61 and 71 respectively.

Figure 11:
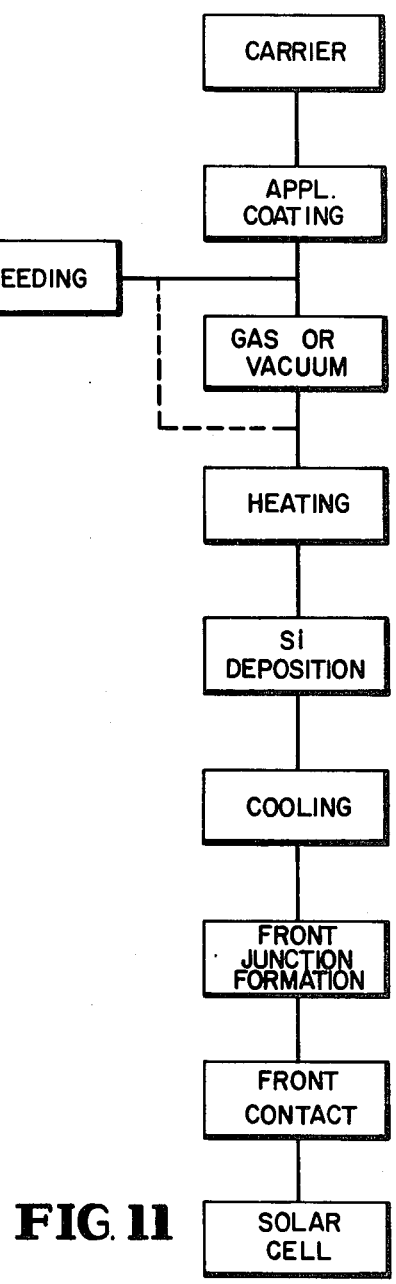
FIG. 11 is a block diagram of successive steps employed in one method of fabrication of solar cells in accordance with the invention.

FIG. 11 shows a flow diagram of the process in which one thin film silicon solar cell is being fabricated. The following steps are utilized in this fabrication process. The carrier film which may be supplied from a roll or from strips is coated with a coating material. The carrier film being a material the melting point of which is above the deposition temperature as described previously. This carrier film will be coated in the coating application step by the coating material. This coated carrier film is then introduced in a gas or a vacuum environment. Before the silicon deposition is started an initial seeding step is required. The seeding can be performed either by applying previously prepared silicon single crystal seed or by a mechanical shutter system or a combination of these. The seeding step may take place either in the gas or vacuum environment or before the coated carrier enters this gas or vacuum environment. After the seeded or coated carrier is introduced in the gas or vacuum environment a heating step is taking place. During the heating step the coating metal melts and subsequently the silicon deposition step takes place. The next step is the cooling process in which the coating and on top of it the silicon is solidifying. The next step is the front junction formation followed by a front contact formation which completes the process and the solar cell is ready. The front contact may be a conductive pattern or film. The conductive material may be a metal, combination of metals or a conductive transparent film. The metals found to be suitable are aluminum, chromium, tantalum, silver gold, copper, titanium, nickel or others used in making contacts on silicon material. The transparent film may be made by the deposition of oxides of tin or indium.

While the invention has been particularly shown and described with reference to preferred embodiments thereof, it will be understood by those skilled in the art that several variations in the form and details in the above can be made without departing from the spirit and scope of the invention.

What is claimed is:

1. A method of making a thin film of substantially monocrystalline silicon suitable for use in silicon solar cells, comprising
   a. providing a carrier having a melting point above the temperature at which the silicon is to be deposited.
   b. applying to the carrier a coating that is maintained in a liquid state at least at the region at which the silicon is to be deposited, said coating comprising an impurity that acts as a dopant for the silicon,
   c. depositing a seed of silicon crystal on the liquid carrier coating,
   d. directing the deposition of silicon on said coating by means that limits the area of said coating subject to deposition,
   e. effecting relative movement between said silicon deposition limiting means and said carrier so that the silicon seed is expanded in a lateral direction into a film of silicon, and
   f. continuing said relative movement at a rate and direction of deposition such that later deposited silicon orients itself to the previously deposited silicon in a lateral and highly ordered form as contrasted with amorphous, epitaxial growth and the dopant in the liquid coating diffuses into the silicon to form a doped layer therein.

2. A method as claimed in claim 1, in which said coating is heated above its melting point prior to the deposition of silicon thereon.

3. A method as claimed in claim 2, in which said coating is cooled below its melting point subsequent to the deposition of silicon thereon.

4. A method as claimed in claim 1, in which said silicon deposition directing means includes barrier lines that diverge laterally so that on movement of the carrier the area of deposition of silicon will expand transversely of the coating as said barrier lines diverge.

5. A method as claimed in claim 4, in which said barrier lines are in the form of raised strips on the surface of the carrier.

6. A method as claimed in claim 1, in which said seed of silicon crystal is in the form of a strip of substantially monocrystalline silicon extending transversely across at least part of the carrier.

7. A method as claimed in claim 6, in which said strip of monocrystalline silicon is formed by the process according to claim 1.

8. A method as claimed in claim 1, in which the liquid coating includes lead, which is inert with respect to the silicon deposited.

9. A method as claimed in claim 1, in which the dopant is selected from the group consisting of aluminum, indium and arsenic.

10. A method as claimed in claim 1, in which the liquid coating includes lead, which is inert with respect to the silicon deposited, and a dopant selected from the group consisting of aluminum, indium and arsenic.

11. A method of making a thin film of substantially monocrystalline silicon suitable for use in silicon solar cells, comprising
   a. providing a carrier having a melting point above the temperature at which the silicon is to be deposited,
   b. applying to the carrier a coating that is maintained in a liquid state at least at the region at which the silicon is to be deposited, said coating comprising an impurity that acts as a dopant for the silicon,
   c. providing means for depositing silicon on said liquid coating from a vapor state,
   d. utilizing a mechanical barrier to direct the deposition of silicon on said coating so that at least initially the field of such deposition expands transversely of said carrier as relative movement is effected between said carrier and said depositing means,
   e. effecting lateral relative movement between said silicon depositing means and said carrier so that silicon is deposited laterally on the coating of said carrier, and
   f. continuing said relative movement at a rate and direction of deposition such that later deposited silicon orients itself to the previously deposited silicon in a lateral and highly ordered manner as contrasted with amorphous, epitaxial growth and the dopant in the liquid coating diffuses into the silicon to form a doped layer therein.

12. A method as claimed in claim 11, in which said mechanical barrier has diverging surfaces that increasingly permit transverse deposition of silicon on the carrier coating as relative movement is effected between the carrier and the depositing means.

* * * * *